(12) United States Patent
Lee

(10) Patent No.: US 7,365,595 B2
(45) Date of Patent: Apr. 29, 2008

(54) INTERNAL VOLTAGE GENERATOR

(75) Inventor: Soon-seob Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 105 days.

(21) Appl. No.: 11/387,369

(22) Filed: Mar. 23, 2006

(65) Prior Publication Data

US 2006/0227633 A1    Oct. 12, 2006

(30) Foreign Application Priority Data

Mar. 23, 2005    (KR) ............... 10-2005-0024073

(51) Int. Cl.
    *G05F 1/10*    (2006.01)
(52) U.S. Cl. ................... 327/538; 327/63
(58) Field of Classification Search ............ None
    See application file for complete search history.

(56) References Cited

U.S. PATENT DOCUMENTS

| | | | |
|---|---|---|---|
| 4,613,810 A * | 9/1986 | Jablonski et al. | 323/271 |
| 4,906,914 A * | 3/1990 | Ohsawa | 323/314 |
| 5,027,053 A * | 6/1991 | Ohri et al. | 323/314 |
| 5,317,254 A * | 5/1994 | Olson | 323/316 |
| 5,369,354 A | 11/1994 | Mori | |
| 5,831,472 A * | 11/1998 | Wang et al. | 327/543 |
| 5,936,455 A * | 8/1999 | Kobayashi et al. | 327/437 |
| 6,201,378 B1 * | 3/2001 | Eto et al. | 323/313 |
| 6,265,858 B1 * | 7/2001 | Park | 323/313 |
| 6,628,162 B2 * | 9/2003 | Kondo et al. | 327/540 |
| 6,781,443 B2 * | 8/2004 | Hamamoto et al. | 327/541 |
| 6,798,276 B2 * | 9/2004 | Mori et al. | 327/541 |
| 7,176,752 B2 * | 2/2007 | Hashimoto et al. | 327/541 |
| 2003/0038617 A1 | 2/2003 | Yaklin | |
| 2004/0075485 A1 | 4/2004 | Chun | 327/427 |
| 2004/0251957 A1 * | 12/2004 | Do | 327/541 |

FOREIGN PATENT DOCUMENTS

| | | |
|---|---|---|
| JP | 06-338188 | 12/1994 |
| JP | 08-221142 | 8/1996 |
| JP | 09-212247 | 8/1997 |
| KR | 10-2003-0057825 | 7/2003 |

* cited by examiner

*Primary Examiner*—Cassandra Cox
(74) *Attorney, Agent, or Firm*—Mills & Onello LLP

(57) ABSTRACT

An internal voltage generator is highly tolerant of electrical parameter changes of transistors occurring due to process deviation. The generator can produce an internal voltage within a short setup time when there is a significant difference between a voltage level of an internal voltage when power is initially supplied to the internal voltage generator and a voltage level of an internal voltage to be produced. In one embodiment, the internal voltage generator of the present invention includes a comparator block and an output driving block to produce an internal voltage. The internal voltage generator further includes a reference voltage generation block, which generates at least two reference voltages to be supplied to the comparator block, and an offset section control block, which supplies a control signal for optimizing an offset section, that is, a voltage difference between the reference voltages, to the reference voltage generation block. The internal voltage generator can further optionally include an auxiliary output driving block in addition to a main output driving block to reduce the setup time for which the internal voltage is produced when voltage is initially supplied and to reduce power consumption. The internal voltage generator further includes a first control signal generation block and a control block to control operations of the main and auxiliary output driving blocks.

52 Claims, 8 Drawing Sheets

INTERNAL VOLTAGE GENERATOR

CROSS-REFERENCE TO RELATED PATENT APPLICATIONS

This application claims the benefit of Korean Patent Application No. 10-2005-0024073, filed on Mar. 23, 2005, in the Korean Intellectual Property Office, the disclosure of which is incorporated herein in its entirety by reference.

BACKGROUND OF THE INVENTION

1. Field of the Invention

The present invention relates to an internal voltage generator installed within a semiconductor memory device, and more particularly, to an internal voltage generator that prevents a center value in a Gaussian distribution of a produced internal voltage from largely moving even when a process parameter severely deviates during the manufacture of a semiconductor memory device, that reduces a setup time for an internal voltage, and that minimizes power consumption, thereby improving the yield.

2. Description of the Related Art

Semiconductor memory devices employ not only an external high supply voltage and an external low supply voltage, of which a ground voltage is representative, but also generate and utilize an internal voltage having a voltage level between the high and low supply voltages the parameters of which are determined in consideration of consumed power and device operating speed.

FIG. 1 is a circuit diagram of a conventional internal voltage generator 100. Referring to FIG. 1, the internal voltage generator 100 includes a reference voltage generation block 110, a comparator block 120, and an output driving block 130.

The reference voltage generation block 110 includes a plurality of resistors R1, R2, and R3 serially connected to each other between a high supply voltage VDD and a low supply voltage GND. The reference voltage generation block 110 selects two voltage drop values among the resistors R1, R2, and R3 and outputs the selected two voltages as a first reference voltage VL and a second reference voltage VH. The first reference voltage VL has a voltage level that is lower than the level of the second reference voltage VH.

The comparator block 120 includes two comparators, namely, a first comparator 121 and a second comparator 122. The first reference voltage VL is applied to a negative input port (−) of the first comparator 121, and an internal voltage VCNT is applied to a positive input port (+) thereof. The internal voltage VCNT is a final voltage level that is generated by the internal voltage generator 100. The second reference voltage VH is applied to a negative input port (−) of the second comparator 122, and the internal voltage VCNT is applied to a positive input port (+) thereof. The first comparator 121 compares the first reference voltage VL with the internal voltage VCNT and outputs a first comparison voltage UPB as a result of the comparison. The second comparator 122 compares the second reference voltage VH with the internal voltage VCNT and outputs a second comparison voltage DN as a result of the comparison. The first and second comparators are open-loop-configured operational amplifiers.

The output driving block 130 includes a P-type MOS transistor MP1, an N-type MOS transistor MN1, and a capacitor C. The P-type MOS transistor MP1 has one end connected to a high supply voltage VDD and a gate to which the first comparison voltage UPB is applied. The N-type MOS transistor MN1 has one end connected to a low supply voltage GND and a gate to which the second comparison voltage DN is applied. The capacitor C has one end connected to a low supply voltage GND and the other end connected to both the other end of the P-type MOS transistor MP1 and the other end of the N-type MOS transistor MN1.

When the P-type MOS transistor MP1 is turned on, current flowing from the high supply voltage VDD is stored in the form of charge in the capacitor C. When the N-type MOS transistor MN1 is turned on, the charge stored in the capacitor C is discharged to a low supply voltage GND. A voltage level of a voltage drop in the capacitor C is equal to the high supply voltage VDD when charge has been stored in the capacitor C, and is equal to the low supply voltage GND when charge has been discharged from the capacitor C.

In an operation of the conventional internal voltage generator 100 of FIG. 1, currents IUP and IDN flowing in the two MOS transistors MP1 and MN1 are controlled in response to the two comparison voltages UPB and DN produced by the two reference voltages VL and VH and the internal voltage VCNT. The level of the internal voltage VCNT depends upon the amounts of current flowing in the two MOS transistors MP1 and MN1. An internal voltage VCNT having a predetermined level is fed back to the comparator block 120 and changes the voltage levels of the comparison voltages UPB and DN of the first and second comparators 121 and 122. The internal voltage VCNT has a final voltage level that is between the two reference voltages VL and VH (i.e., VL<VCNT<VH). The time period that lapses from the time when a power supply is being applied to a time when a level of the internal voltage VCNT reaches a predetermined voltage level is referred to as a setup time.

When the two MOS transistors MP1 and MN1 of the output driving block 130 are simultaneously turned on, a direct path of current flows between the high supply voltage VDD and the low supply voltage GND. The direct path of current is not necessary and causes a waste of power. Accordingly, to prevent the two MOS transistors MP1 and MN1 from being simultaneously turned on, a voltage difference between the two reference voltages VL and VH, that is, an offset section OFFSET, is increased.

FIG. 2 is a graph showing a relationship among a plurality of internal voltages within the voltage generator 100. Referring to FIG. 2, an area between the two reference voltages VL and VH is referred to as an offset section VOFFSET, and a hatched area of the offset section VOFFSET where the two MOS transistors MP1 and MN1 are simultaneously turned off is referred to as a dead zone VDZ. In the dead zone VDZ, a direct path current flows from a high supply voltage VDD to a low supply voltage GND, and the internal voltage VCNT is not accurately adjusted. Hence, it is preferable that the dead zone VDZ is narrow. Considering that gains of the first and second comparators 121 and 122 are not infinite, it is evident that the dead zone VDZ is narrower than the offset section VOFFSET. In FIG. 2, VTP denotes a threshold voltage of the first MOS transistor MP1, and VTN denotes a threshold voltage of the second MOS transistor MN1.

FIG. 3 is a graph showing a relationship among a plurality of voltages within the internal voltage generator 100 that are affected by an offset error and a gain error made by the comparators constituting the comparator block 120 of FIG. 1.

Referring to FIG. 3, even when the first and second comparators 121 and 122 have offset voltages of opposite polarities, the two MOS transistors MP1 and MN1 are simultaneously turned on, so that a direct path current may flow between a high supply voltage VDD and a low supply voltage GND. A dotted characteristic curve indicates a case where no offset is generated, and a solid characteristic curve indicates a case where an offset has been generated.

To overcome an offset error and a gain error of the comparators 121 and 122 generated due to a deviation occurring in the manufacture of a semiconductor memory device, the offset section VOFFSET should be made wider. Furthermore, the two reference voltages VL and VH determined by the serially connected resistors R1, R2, and R3 are greatly affected by the process deviation. Accordingly, the offset section VOFFSET must be widened even further to improve the yield of a semiconductor device.

However, the widening of the offset section VOFFSET to improve the yield of a semiconductor device and to overcome offset and gain errors can lead to the following problems. First, the dead zone VDZ increases with an increase of the offset section VOFFSET.

Second, an intermediate value of a wide offset section VOFFSET, which is used as a voltage level of the internal voltage VCNT, can change according to the accuracy of a process, so it is not easy to produce an internal voltage VCNT having a designated voltage level.

The internal voltage generator 100 of FIG. 1 also has another problem, in the form of setup time. When receiving initial power, the internal voltage generator 100 should produce an internal voltage VCNT within a short period of time. A determination of whether the internal voltage VCNT has been produced within a short period of time is made based on the setup time.

When there is a significant difference between a voltage level of the internal voltage VCNT biased when an initial supply voltage is supplied to the internal voltage generator 100 and a desired voltage level of the internal voltage VCNT, the internal voltage VCNT can be produced within a shorter period of time as more current is supplied or discharged by the P-type and N-type MOS transistors MP1 and MN1. However, since the sizes of the two MOS transistors MP1 and MN1 are set during manufacturing, the amount of current that flows cannot be arbitrarily controlled.

SUMMARY OF THE INVENTION

The present invention provides an internal voltage generator that is greatly tolerant of variation generated in internal devices, such as transistors, due to deviations occurring in the manufacture of semiconductor memory devices.

The present invention also provides an internal voltage generator that can produce an internal voltage within a short setup time.

According to an aspect of the present invention, there is provided an internal voltage generator including a reference voltage generation block, a comparator block, an output driving block, and an offset section control block. The reference voltage generation block outputs a first reference voltage, a second reference voltage, and a third reference voltage in response to a plurality of switch control signals. The comparator block outputs a first comparison voltage as a result of a comparison between an internal voltage and the third reference voltage and a second comparison voltage as a result of a comparison between the internal voltage and the second reference voltage. The output driving block outputs the internal voltage in response to the first and second comparison voltages. The offset section control block outputs the plurality of switch control signals in response to the first, second, and third reference voltages and a clock signal.

In one embodiment, the comparator block comprises: a first comparator comparing the internal voltage with the third reference voltage to generate the first comparison signal; and a second comparator comparing the internal voltage with the second reference voltage to generate the second comparison signal.

In another embodiment, the output driving block comprises: a first MOS transistor having one end connected to a high supply voltage and a gate to which the first comparison voltage is applied; a second MOS transistor having one end connected to a low supply voltage and a gate to which the second comparison voltage is applied; and a first capacitor having one end connected to both the other ends of the first and second MOS transistors and the other end connected to the low power supply voltage, wherein the internal voltage is output at a common port shared by the first and second MOS transistors and the first capacitor.

In another embodiment, the first MOS transistor is a P-type MOS transistor, and the second MOS transistor is an N-type MOS transistor.

In another embodiment, the reference voltage generation block comprises: a plurality of resistors serially connected between a high supply voltage and a low supply voltage; the first reference voltage being a voltage at a node connection of a predetermined two of the serially connected resistors; a first switch block outputting the second reference voltage corresponding to a voltage at a selected node connection of a plurality of node connections of resistors between the voltage corresponding to the first reference voltage and the high supply voltage, in response to a first plurality of switch control signals; and a second switch block outputting the third reference voltage corresponding to a voltage at a selected node connection of a plurality of node connections of resistors between the voltage corresponding to the first reference voltage and the low supply voltage, in response to the residual switch control signals.

In another embodiment: the first plurality of switch control signals are a 0H (where 0 is zero) switch control signal through an NH (where N is an integer greater than 0) switch control signal; the resistors between the joint voltage corresponding to the first reference voltage and the high supply voltage include: a 0H resistor having one end connected to the first reference voltage; a 1H resistor having one end connected to the other end of the 0H resistor; a 2H resistor having one end connected to the other end of the 1H resistor; through a (N+1)H resistor having one end connected to the other end of an NH resistor and the other end connected to the high supply voltage; and the first switch block comprises: a 0H switch having one end connected to a common node of the 0H and 1H resistors, operating in response to the 0H switch control signal; a 1H switch having one end connected to a common node of the 1H and 2H resistors, operating in response to the 1H switch control signal; through an NH switch having one end connected to a common node of the NH and (N+1)H resistors, operating in response to the NH switch control signal, wherein the other ends of the 0H through NH switches are commonly connected to one other and the second reference voltage is output through one of the other ends of the 0H through NH switches.

In another embodiment: the second plurality of switch control signals are a 0L (where 0 is zero) switch control signal through an NL (where N is an integer greater than 0) switch control signal; the resistors between the joint voltage corresponding to the first reference voltage and the low supply voltage include: a 0L resistor having one end connected to the first reference voltage; a 1L resistor having one end connected to the other end of the 0L resistor; a 2L resistor having one end connected to the other end of the 1L resistor; through a (N+1)L resistor having one end connected to the other end of an NL resistor and the other end connected to the low supply voltage; and the second switch block comprises: a 0L switch having one end connected to a common node of the 0L and 1L resistors, operating in response to the 0L switch control signal; a 1L switch having one end connected to a common node of the 1H and 2H resistors, operating in response to the 1L switch control signal; through an NL switch having one end connected to a common node of the NL and (N+1)L resistors, operating in response to the NL switch control signal, wherein the other ends of the 0L through NL switches are commonly connected to one other and the third reference voltage is output through one of the other ends of the 0L through NL switches.

In another embodiment, the first reference voltage has a voltage level in between the high supply voltage and the low supply voltage.

In another embodiment, the offset section control block comprises: a first offset section control block outputting an 0H switch control signal through an NH switch control signal in response to the first and second reference voltages and the clock signal; and a second offset section control block outputting an 0L switch control signal through an NL switch control signal in response to the first and third reference voltages and the clock signal.

In another embodiment, the first offset section control block comprises: a third comparator outputting a third comparison voltage as a result of a comparison between the first and second reference voltages; a first turn-off voltage sensing circuit sensing in response to the third comparison voltage and the clock signal whether the third comparison voltage has a voltage level satisfying a predetermined condition, and outputting a first sensing signal corresponding to a result of the sensing; a first transmission circuit outputting a first control signal into which the first sensing signal is transformed in response to the clock signal; and a first switch control signal generator outputting the 0H through NH switch control signals in response to the first control signal.

In another embodiment, the predetermined condition is to determine whether the third comparison voltage is sufficient to turn off a predetermined MOS transistor included in the output driving block.

In another embodiment, the predetermined MOS transistor is the second MOS transistor.

In another embodiment, the first turn-off voltage sensing circuit comprises: a third MOS transistor having one end connected to a high supply voltage and a gate to which the clock signal is applied; a fourth MOS transistor having one end connected to a low supply voltage and a gate to which the third comparison voltage is applied; and a second capacitor having one end connected to both the other ends of the third and fourth MOS transistors and the other end connected to a low supply voltage, wherein the first sensing signal is output at a common port shared by the third and fourth MOS transistors and the second capacitor.

In another embodiment: a ratio of a length to a width of a gate of the third MOS transistor is identical to a ratio of a length to a width of a gate of the first MOS transistor; and a ratio of a length to a width of a gate of the fourth MOS transistor is identical to a ratio of a length to a width of a gate of the second MOS transistor.

In another embodiment, the first transmission circuit comprises: a first inverter inverting a phase of the first sensing signal; and a second NOR gate outputting the first control signal in response to an output of the first inverter and the clock signal.

In another embodiment, the first switch control signal generator further receives a set signal and a reset signal and comprises: a 1H shift register setting an output according to the set signal and, in response to the first control signal, storing a predetermined signal and outputting the 0H switch control signal; a 2H shift register resetting an output according to the reset signal and, in response to the first control signal, storing the 0H switch control signal and outputting the 1H switch control signal; a 3H shift register resetting an output according to the reset signal and, in response to the first control signal, storing the 2H switch control signal and outputting the 2H switch control signal; through an (N+1)H shift register resetting an output according to the reset signal and, in response to the first control signal, storing an NH switch control signal output from an NH shift register and outputting the NH switch control signal.

In another embodiment, the second offset section control block comprises: a fourth comparator outputting a fourth comparison voltage as a result of a comparison between the first and third reference voltages; a second turn-off voltage sensing circuit sensing in response to the fourth comparison voltage and the clock signal whether the fourth comparison voltage has a voltage level satisfying a predetermined condition, and outputting a second sensing signal corresponding to a result of the sensing; a second transmission circuit outputting a second control signal into which the second sensing signal is transformed in response to the clock signal; and a second switch control signal generator outputting the 0L through NL switch control signals in response to the second control signal.

In another embodiment, the predetermined condition is to determine whether the third comparison voltage is sufficient to turn off a predetermined MOS transistor included in the output driving block.

In another embodiment, the predetermined MOS transistor is the first MOS transistor.

In another embodiment, the second turn-off voltage sensing circuit comprises: a fifth MOS transistor having one end connected to a high supply voltage and a gate to which the fourth comparison voltage is applied; a sixth MOS transistor having one end connected to a low supply voltage and a gate to which the clock signal is applied; and a third capacitor having one end connected to both the other ends of the fifth and sixth MOS transistors and the other end connected to a low supply voltage, wherein the second sensing signal is output at a common port shared by the fifth and sixth MOS transistors and the third capacitor.

In another embodiment: a ratio of a length to a width of a gate of the fifth MOS transistor is identical to a ratio of a length to a width of a gate of the first MOS transistor; and a ratio of a length to a width of a gate of the sixth MOS transistor is identical to a ratio of a length to a width of a gate of the second MOS transistor.

In another embodiment, the second transmission circuit comprises: a second inverter inverting a phase of the second sensing signal; and a second NOR gate outputting the second control signal in response to an output of the second inverter and the clock signal.

In another embodiment, the second switch control signal generator further receives a set signal and a reset signal and comprises: a 1L shift register setting an output according to the set signal and, in response to the second control signal, storing a predetermined signal and outputting the 0L switch control signal; a 2L shift register resetting an output according to the reset signal and, in response to the second control signal, storing the 0L switch control signal and outputting the 1L switch control signal; a 3L shift register resetting an output according to the reset signal and, in response to the second control signal, storing the 2L switch control signal and outputting the 2L switch control signal; through an (N+1)L shift register resetting an output according to the reset signal and, in response to the second control signal, storing an NL switch control signal output from an NL shift register and outputting the NL switch control signal.

In another embodiment, the clock signal continues a clocking operation for a period of time that is long enough to generate at least all of the plurality of switch control signals.

According to another aspect of the present invention, there is provided an internal voltage generator including a reference voltage generation block, a comparator block, a first control signal generation block, a control block, and an output driving block. The reference voltage generation block outputs a first reference voltage and a second reference voltage. The comparator block outputs a first comparison voltage as a result of a comparison between an internal voltage and the first reference voltage and a second comparison voltage as a result of a comparison between the internal voltage and the second reference voltage. The first control signal generation block outputs a first control signal and a second control signal in response to the first and second comparison voltages. The control block generates a third control signal and a fourth control signal in response to the first and second comparison voltages and the first and second control signals. The output driving block generates the internal voltage in response to the first and second comparison voltages and the third and fourth control signals.

In one embodiment, the first control signal generation block comprises: a first inverter inverting a phase of the first comparison signal; an EX-OR gate outputting the first control signal in response to an output of the first inverter and the second comparison voltage; and a second inverter outputting the second control signal obtained by inverting the first control signal.

In another embodiment, a logic high or low state of the third control signal is opposite a logic high or low state of the fourth control signal.

In another embodiment, the control block comprises: a NOR gate outputting the third control signal in response to the first comparison voltage, the first control signal, and the fourth control signal; and a NAND gate outputting the fourth control signal in response to the second comparison voltage, the second control signal, and the third control signal.

In another embodiment, the output driving block comprises: a main output driving block operating in response to the third and fourth control signals; and an auxiliary output driving block operating in response to the first and second comparison voltages, wherein the main and auxiliary output driving blocks commonly output the internal voltage.

In another embodiment, the main output driving block comprises: a first MOS transistor having one end connected to a high supply voltage and a gate to which the third control signal is applied; a second MOS transistor having one end connected to a low supply voltage and a gate to which the fourth control signal is applied; and a capacitor having one end connected to both the other ends of the first and second MOS transistors and the other end connected to the low power supply voltage, wherein the internal voltage is output at a common port shared by the first and second MOS transistors and the capacitor.

In another embodiment, the auxiliary output driving block comprises: a third MOS transistor having one end connected to a high supply voltage and a gate to which the first control signal is applied; and a fourth MOS transistor having one end connected to a low supply voltage and a gate to which the second control signal is applied, wherein the other ends of the third and fourth MOS transistors are connected to each other and output the internal voltage.

In another aspect, the present invention is directed to an internal voltage generator comprising: a reference voltage generation block outputting a first reference voltage, a second reference voltage, and a third reference voltage in response to a plurality of switch control signals; a comparator block outputting a first comparison voltage as a result of a comparison between an internal voltage and the third reference voltage and a second comparison voltage as a result of a comparison between the internal voltage and the second reference voltage; a first control signal generation block outputting a first control signal and a second control signal in response to the first and second comparison voltages, respectively; a control block generating a third control signal and a fourth control signal in response to the first and second comparison voltages and the first and second control signals; an output driving block generating the internal voltage in response to the third and fourth control signals; and an offset section control block outputting the plurality of switch control signals in response to the first, second, and third reference voltages and a clock signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
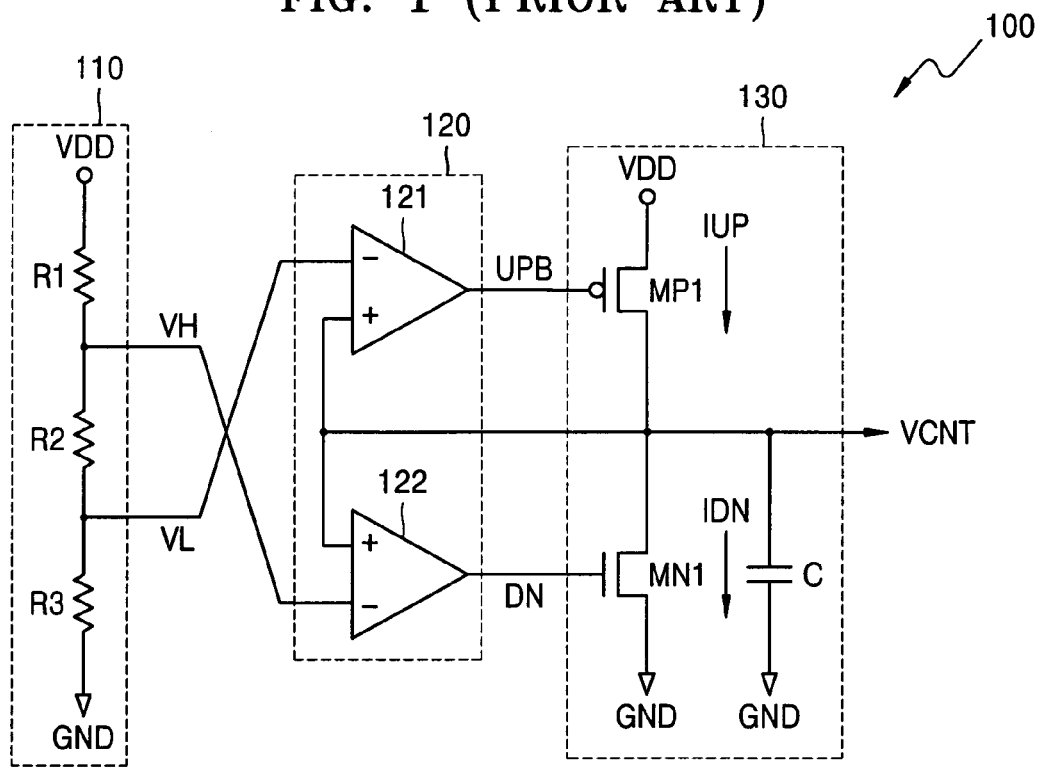
FIG. 1 is a circuit diagram of a conventional internal voltage generator.
Figure 2:
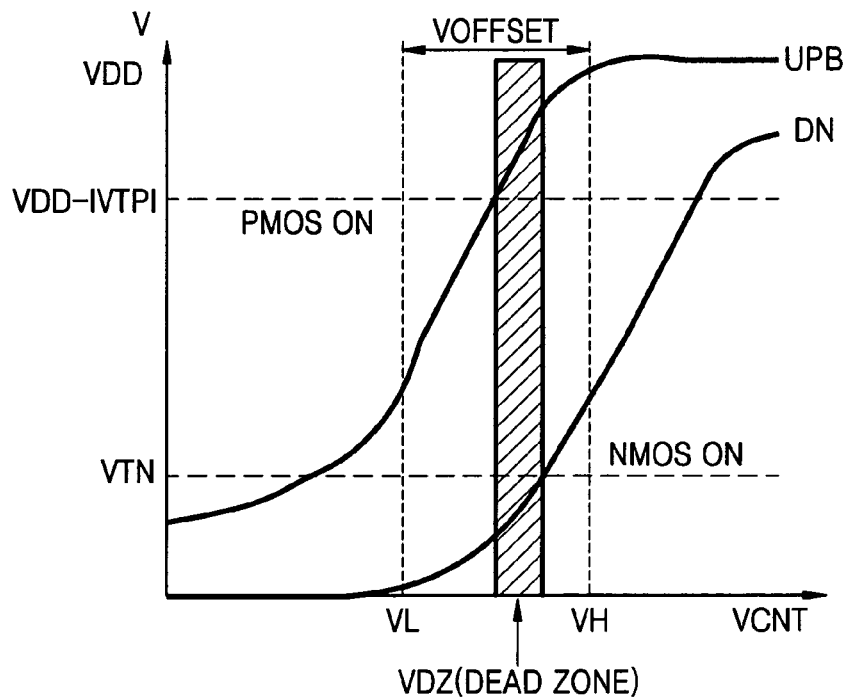
FIG. 2 is a graph showing a relationship among a plurality of internal voltages within the voltage generator 100.
Figure 3:
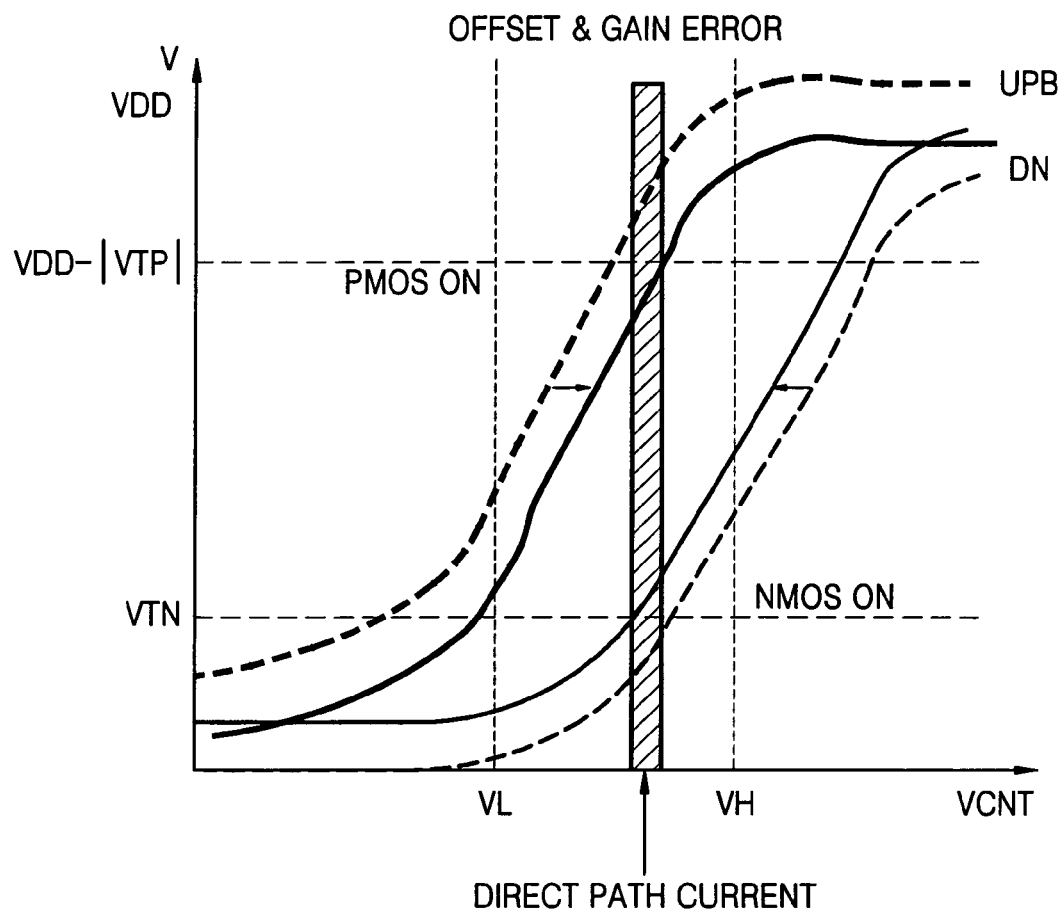
FIG. 3 is a graph showing a relationship among a plurality of voltages within the internal voltage generator of FIG. 1 that are affected by an offset error and a gain error made by comparators that constitute a comparator block of FIG. 1.

The attached drawings for illustrating preferred embodiments of the present invention are referred to in order to gain a sufficient understanding of the present invention, the merits thereof, and the objectives accomplished by the implementation of the present invention. Hereinafter, the present invention will be described in detail by explaining preferred embodiments of the invention with reference to the attached drawings. Like reference numerals in the drawings denote like elements.

Figure 4:
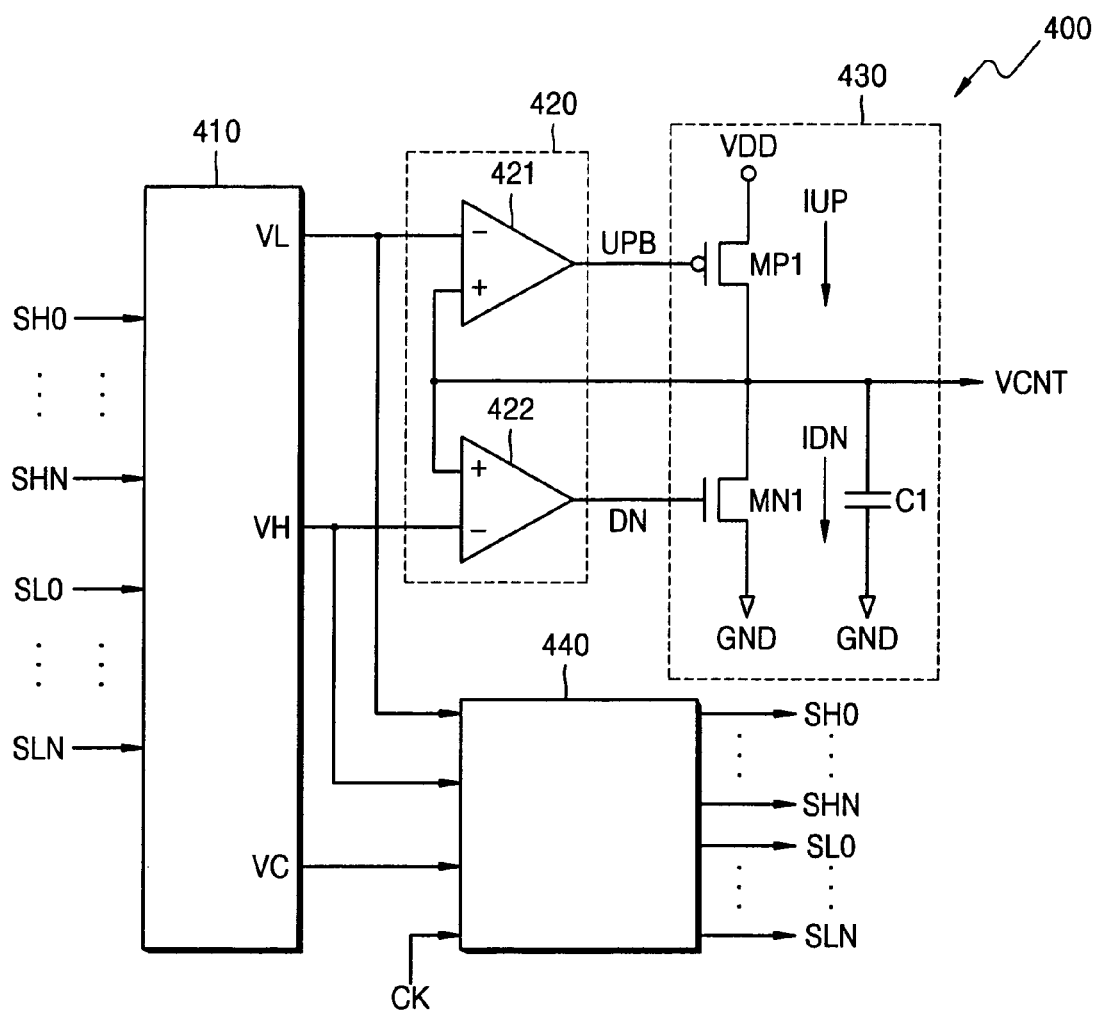
FIG. 4 is a block diagram of an internal voltage generator according to an embodiment of the present invention.

FIG. 4 is a block diagram of an internal voltage generator 400 according to an embodiment of the present invention. Referring to FIG. 4, the internal voltage generator 400 includes a reference voltage generation block 410, a comparator block 420, an output driving block 430, and an offset section control block 440.

The reference voltage generation block 410 outputs a first reference voltage VC, a second reference voltage VH, and a third reference voltage VL in response to a plurality of switch control signals SH0 through SHN and SL0 through SLN.

The comparator block 420 includes a first comparator 421 and a second comparator 422. The first comparator 421 compares a fed-back internal voltage VCNT with the third reference voltage VL and produces a first comparison voltage UPB. The second comparator 422 compares the fed-back internal voltage VCNT with the second reference voltage VH and produces a second comparison voltage DN.

The output driving block 430 includes a first MOS transistor MP1, a second MOS transistor MN1, and a first capacitor C1. The first MOS transistor MP1 has one end connected to a high supply voltage VDD and a gate to which the first comparison voltage UPB is applied. The second MOS transistor MN1 has one end connected to a low supply voltage GND and a gate to which the second comparison voltage DN is applied. The first capacitor C1 has one end connected to both the other ends of the first and second MOS transistors MP1 and MN1 and the other end connected to a low supply voltage GND. The voltage level of the internal voltage VCNT is a voltage difference between the common node voltage shared by the first and second MOS transistors MP1 and MN1 and the first capacitor C1 and a low supply voltage GND. When the internal voltage generator 400 is manufactured according to a complementary metal oxide semiconductor (CMOS) process, the first MOS transistor is preferably formed of a P-type MOS transistor, and the second MOS transistor is preferably formed of an N-type MOS transistor.

The offset section control block 440 outputs the switch control signals SH0 through SHN and SL0 through SLN in response to the first, second, and third reference voltages VC, VH, and VL and a clock signal CK. Although not shown in FIG. 4, the offset section control block 440 may further receive a set signal and a reset signal and operate in response to them.

Figure 5:
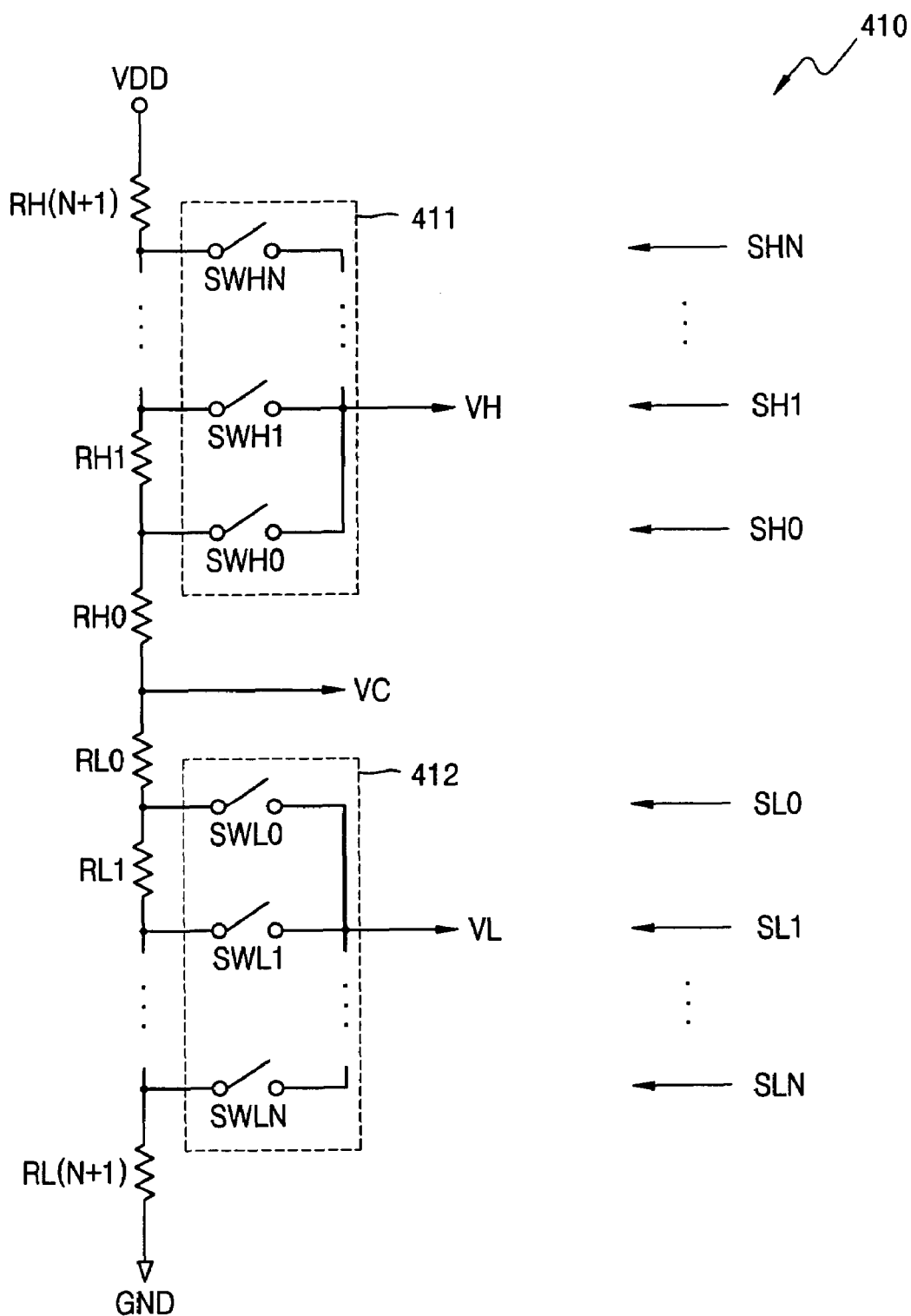
FIG. 5 illustrates an internal circuit of a reference voltage generation block shown in FIG. 4.

FIG. 5 illustrates an internal circuit of the reference voltage generation block 410. Referring to FIG. 5, the reference voltage generation block 410 includes an array of a plurality of resistors RH(N+1) through RL(N+1), a first switch block 411, and a second switch block 412.

A joint voltage between two resistors, namely, resistors RL0 and RH0, is defined as a first reference voltage VC. Generally, the first reference voltage VC has a voltage value of (VDD+GND)/2. The voltage level of the first reference voltage VC should be determined in consideration of a voltage level of the internal voltage VCNT desired by the internal voltage generator 400. Preferably, the first reference voltage VC and the internal voltage VCNT have the same voltage level.

The resistors RH(N+1) through RL(N+1) serially connected between as a high supply voltage VDD and a low supply voltage GND are divided into a first resistor group of resistors RH0 through RH(N+1) located between the first reference voltage VC and the high supply voltage VDD and a second resistor group of resistors RL0 through RL(N+1) located between the first reference voltage VC and the low supply voltage GND.

The first resistor group of resistors RH0 through RH(N+1) is connected to the first switch block 411, which is driven by a first group of switch control signals SH0 through SHN (where N denotes an integer). The second resistor group of resistors RL0 through RL(N+1) is connected to the second switch block 412, which is driven by a second group of switch control signals SL0 through SLN.

In response to the first group of switch control signals SH0 through SHN, the first switch block 411 selects one of a plurality of joint voltage drop values tapped at a junction in the array of serial resistors RH0 through RH(N+1) constituting the first resistor group and outputs the selected joint voltage as the second reference voltage, VH.

In response to the second group of switch control signals SL0 through SLN, the second switch block 412 selects one of joint voltage drop values tapped at a junction in the array of serial resistors RL0 through RL(N+1) constituting the second resistor group and outputs the selected joint voltage as the third reference voltage VL.

Switches that constitute the first and second switch blocks 411 and 412 are switched on or off in response to their corresponding control signals. For example, a switch SWH0 included in the first switch block 411 is switched on or off according to a switch control signal SH0 included in the first group of switch control signals SH0 through SHN. Also, a switch SWH1 included in the first switch block 411 is switched on or off according to a switch control signal SH1 included in the first group of switch control signals SH0 through SHN. This configuration is equally applied to the remaining switches.

Figure 6:
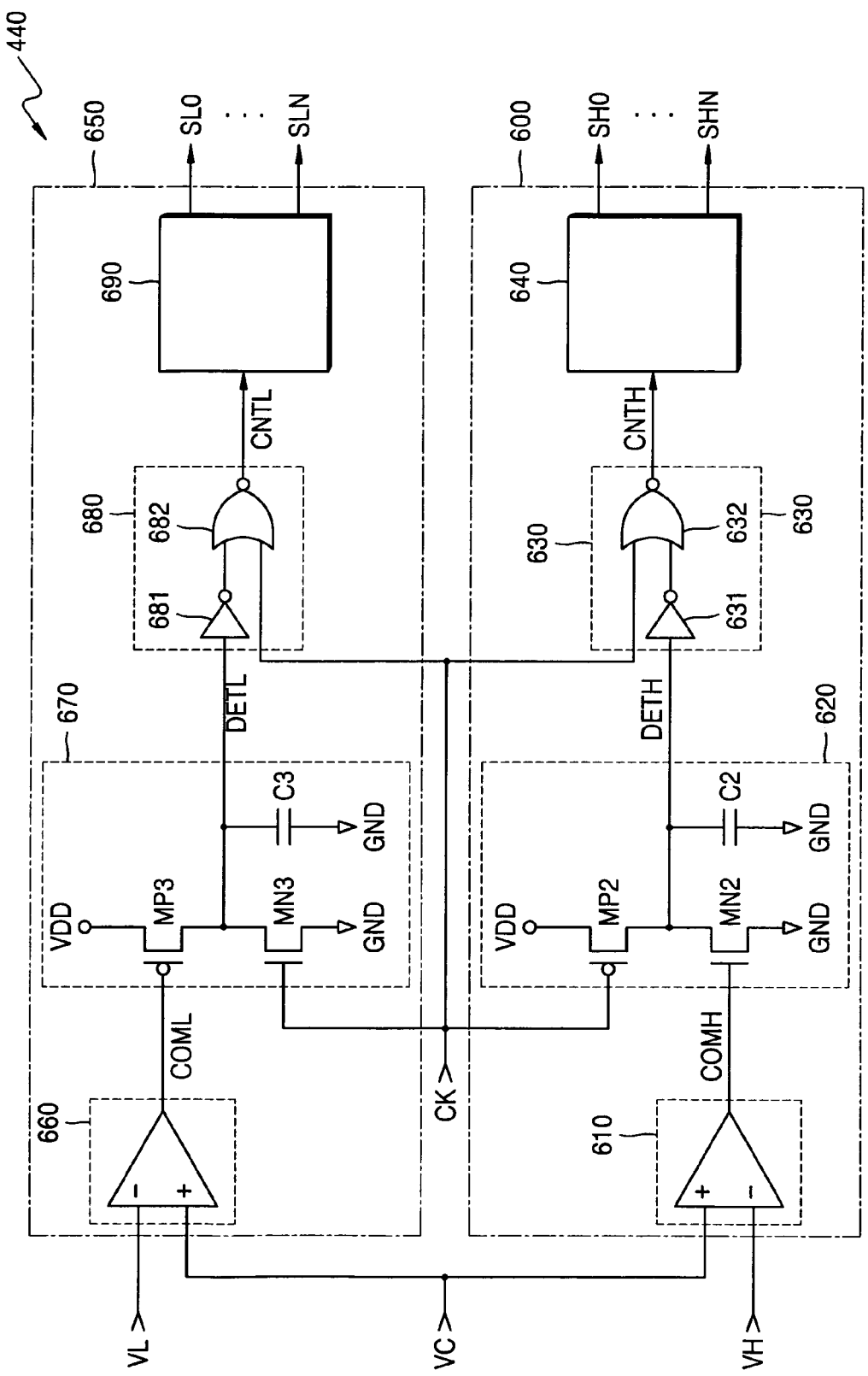
FIG. 6 illustrates an internal circuit of an offset section control block shown in FIG. 4.

FIG. 6 illustrates an internal circuit of the offset section control block 440 shown in FIG. 4. Referring to FIG. 6, the offset section control block 440 includes a first offset section control block 600 and a second offset section control block 650.

The first offset section control block 600 includes a third comparator 610, a first turn-off voltage sensing circuit 620, a first transmission circuit 630, and a first switch control signal generator 640.

The third comparator 610 outputs a third comparison voltage COMH as a result of a comparison between the first and second reference voltages VC and VH. Most of the time, the voltage level of the third comparison voltage COMH is one of a high supply voltage VDD and a low supply voltage GND. Only during a transition of a voltage level to another voltage level is the voltage level of the third comparison voltage COMH between the high supply voltage VDD and the low supply voltage GND.

The first turn-off voltage sensing circuit 620 senses in response to the third comparison voltage COMH and the clock signal CK whether the third comparison voltage COMH has a voltage level satisfying a predetermined condition, and outputs a first sensing signal DETH. Since one switch control signal is produced during one cycle or half a cycle of the clock signal CK, the clock signal CK must be able to perform at least an equal number of clocking operations to the number of switch control signals SH0 through SHN. The predetermined condition is a condition that determines whether the voltage level of the third comparison voltage COMH is large enough to turn off the second MOS transistor MN1 included in the output driving block 430.

To execute this operation, the first turn-off voltage sensing circuit 620 includes a third MOS transistor MP2, a fourth MOS transistor MN2, and a second capacitor C2. The third MOS transistor MP2 has one end connected to a high supply voltage VDD and a gate to which the clock signal CK is applied. The fourth MOS transistor MN2 has one end connected to a low supply voltage GND and a gate to which the third comparison voltage COMH is applied. The second capacitor C2 has one end connected to both the other ends of the third and fourth MOS transistors MP2 and MN2 and outputting the first sensing signal DETH, and the other end connected to a low supply voltage GND.

Current flowing in a MOS transistor is proportional to a ratio (W/L) of a gate width W to a gate length L of the transistor. Transistors having an identical ratio (W/L) flow identical currents. Considering that the first turn-off voltage sensing circuit 620 functions to sense a turn-off voltage of the second MOS transistor MN1 included in the output driving block 430, it is evident that a ratio (W/L) of the third MOS transistor MP2 is the same as that of the first MOS transistor MP1, and a ratio (W/L) of the fourth MOS transistor MN2 is the same as that of the second MOS transistor MN1. Furthermore, it is preferable that the capacitance values of the first and second capacitors C1 and C2 are configured to have a predetermined proportional relationship.

The first transmission circuit 630 includes a first inverter 63, which inverts a phase of the first sensing signal DETH, and a first NOR gate 632, which outputs a first control signal CNTH in response to an output of the first inverter 631 and the clock signal CK.

The first switch control signal generator 640 outputs the switch control signals SH0 through SHN in the first group in response to the first control signal CNTH. The first switch control signal generator 640 will be described in greater detail below with reference to FIG. 7.

The second offset section control block 650 includes a fourth comparator 660, a second turn-off voltage sensing circuit 670, a second transmission circuit 680, and a second switch control signal generator 690.

The fourth comparator 660 outputs a fourth comparison voltage COML as a result of a comparison between the first and third reference voltages VC and VL. Similar to the voltage level of the third comparison voltage COMH, the voltage level of the fourth comparison voltage COML is one of a high supply voltage VDD and a low supply voltage GND most of the time. Only during a transition of a voltage level to another voltage level, is the voltage level of the fourth comparison voltage COML at a level between the high supply voltage VDD and the low supply voltage GND.

The second turn-off voltage sensing circuit 670 senses in response to the fourth comparison voltage COML and the clock signal CK whether the fourth comparison voltage COML has a voltage level satisfying a predetermined condition, and outputs a second sensing signal DETL. The predetermined condition is a condition that determines whether the voltage level of the fourth comparison voltage COML is large enough to turn off the first MOS transistor MP1 included in the output driving block 430.

To execute this operation, the second turn-off voltage sensing circuit 670 includes a fifth MOS transistor MP3, a sixth MOS transistor MN3, and a third capacitor C3. The fifth MOS transistor MP3 has one end connected to a high supply voltage VDD and a gate to which the fourth comparison voltage COML is applied. The sixth MOS transistor MN3 has one end connected to a low supply voltage GND and a gate to which the clock signal CK is applied. The third capacitor C3 has one end connected to both the other ends of the fifth and sixth MOS transistors MP3 and MN3 and outputting the second sensing signal DETL, and the other end connected to a low supply voltage GND.

Similar to the first turn-off voltage sensing circuit 620, in the second turn-off voltage sensing circuit 670, a ratio of a length to a width of a gate of the fifth MOS transistor MP3 is the same as that of the first MOS transistor MP1, and a ratio of a length to a width of a gate of the sixth MOS transistor MN3 is the same as that of the second MOS transistor MN1. Furthermore, it is preferable that the first and third capacitors C1 and C3 are configured to have a predetermined proportional relationship.

The second transmission circuit 680 includes a second inverter 681, which inverts a phase of the second sensing signal DETL, and a second NOR gate 682, which outputs a second control signal CNTL in response to an output of the second inverter 681 and the clock signal CK.

The second switch control signal generator 690 outputs the switch control signals SL0 through SLN in the second group in response to the second control signal CNTL. The second switch control signal generator 690 will be described in greater detail with reference to FIG. 8.

Figure 7:
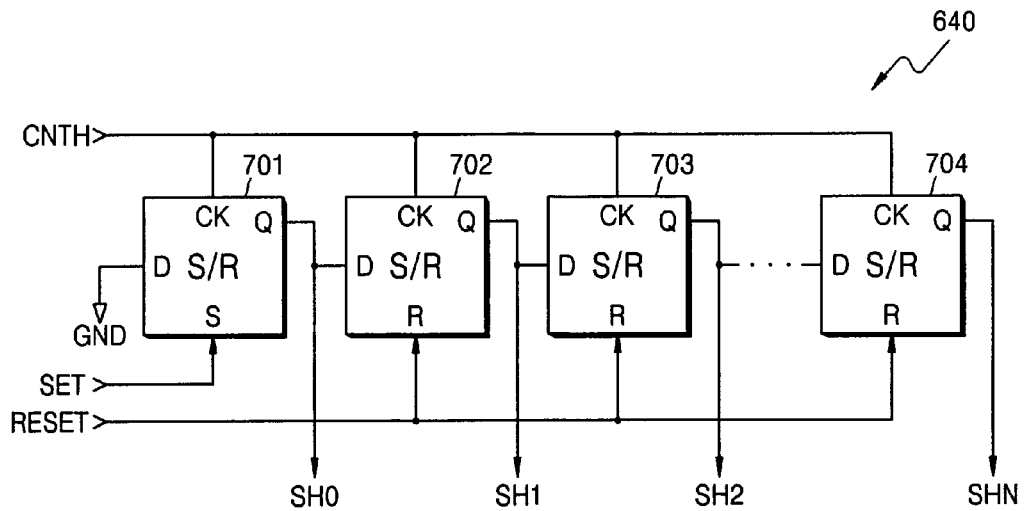
FIG. 7 illustrates an internal circuit of a first switch control signal generator 640 shown in FIG. 6.

FIG. 7 illustrates an internal circuit of the first switch control signal generator 640 shown in FIG. 6. Referring to FIG. 7, the first switch control signal generator 640 includes a plurality of shift registers 701 through 704, which further receive a set signal SET and a reset signal RESET and are driven by the first control signal CNTH.

The 1H shift register 701 sets an output according to the set signal SET, stores a predetermined signal GND in response to the first control signal CNTH, and outputs the 0H switch control signal SH0. The 2H shift register 702 resets an output according to the reset signal RESET, stores the 0H switch control signal SH0 output by the 1H shift register 701 in response to the first control signal CNTH, and outputs the 1H switch control signal SH1. The 3H shift register 703 resets an output according to the reset signal RESET, stores the 1H switch control signal SH1 output by the 2H shift register 702 in response to the first control signal CNTH, and outputs the 2H switch control signal SH2. The (N+1)H shift register 704 resets an output according to the reset signal RESET, stores an (N−1)H switch control signal SH(N−1) output by an NH shift register in response to the first control signal CNTH, and outputs the NH switch control signal SHN.

Figure 8:
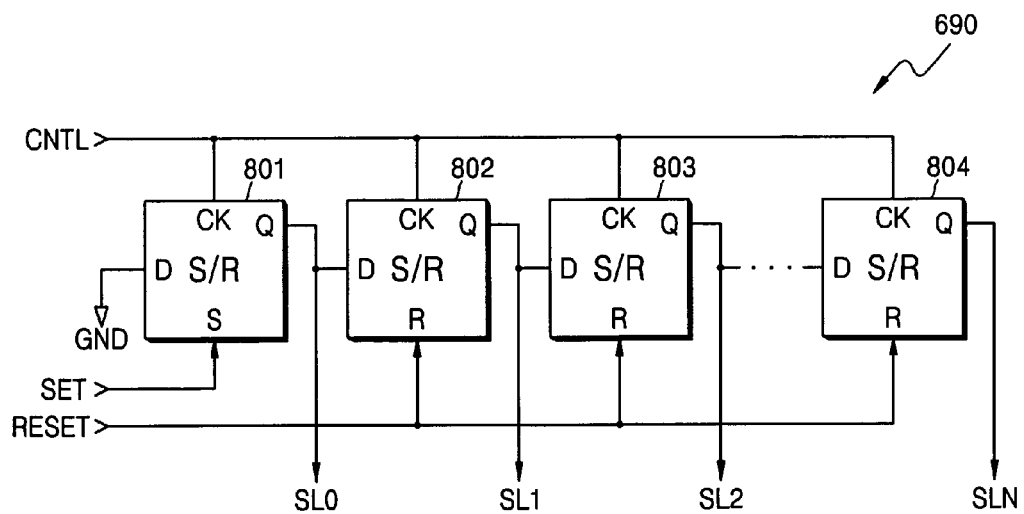
FIG. 8 illustrates an internal circuit of a second switch control signal generator 690 shown in FIG. 6.

FIG. 8 illustrates an internal circuit of the second switch control signal generator 690 shown in FIG. 6. Referring to FIG. 8, the second switch control signal generator 690 includes a plurality of shift registers 801 through 804, which further receive the set signal SET and the reset signal RESET and are driven by the second control signal CNTL.

The 1H shift register 801 sets an output according to the set signal SET, stores a predetermined signal in response to the second control signal CNTL, and outputs the 0L switch control signal SL0. The 2L shift register 802 resets an output according to the reset signal RESET, stores the 0L switch control signal SL0 output by the 1L shift register 801 in response to the second control signal CNTL, and outputs the 1L switch control signal SL1. The 3L shift register 803 resets an output according to the reset signal RESET, stores the 1L switch control signal SL1 output by the 2L shift register 802 in response to the second control signal CNTL, and outputs the 2L switch control signal SL2. The (N+1)L shift register 804 resets an output according to the reset signal RESET, stores an (N−1)L switch control signal SL(N−1) output by an NL shift register in response to the second control signal CNTL, and outputs the NL switch control signal SLN.

An operation of the internal voltage generator 400 will now be described.

In a conventional method of producing an internal voltage, a dead zone VDZ exists among the input offset voltages VH and VL and is determined by the two comparison voltages UPB and DN.

Meanwhile, an internal voltage generator according to the present invention reflects the dead zone VDZ previously recognized from two output comparison voltages UPB and DN when setting an input offset section. In other words, the voltage levels of voltages UPB and DN at which MOS transistors constituting the output driving block 430 are turned off are previously ascertained, and the reference voltages VH and VL are optimized in consideration the voltages UPB and DN.

To accomplish this, first, a plurality of resistors RH(N+1) through RL(N+1) and a plurality of switches SWHN through SWLN connected to ports of the resistors RH(N+1) through RL(N+1) are used in the reference voltage generation block 410. In other words, in the conventional approach described above, since reference voltages are determined during the manufacture of a semiconductor device, the reference voltages could not be later changed. However, in the present invention, the reference voltage can be changed and adjusted at a later time by an internal operation of an internal voltage generator.

Second, in the present invention, voltage levels that are suitable for turning off the MOS transistors MP1 and MN1 of the output driving block 430 are previously ascertained using the offset section control block 440. Also, in response, the offset section control block 440 outputs a plurality of switch control signals SH0 through SHN and SL0 through SLN that reflects the ascertained turn-off voltages in the generation of the reference voltages VL and VH.

Determinations as to whether voltage levels are sufficient to turn off the MOS transistors MP1 and MN1 included in the output driving block 430 are determined in the two turn-off voltage sensing circuits 620 and 670.

To internally determine the third reference voltage VL, the second turn-off voltage sensing circuit 670 in which electrical characteristics of the MOS transistors MP1 and MN1 and the first capacitor C1 that constitute the output driving block 430 are reflected without change is used. To have the same electrical characteristics, it is preferred that the output driving block 430 and the second turn-off voltage sensing circuit 670 use MOS transistors with identical sizes and driving capabilities and capacitors with identical sizes and identical driving capabilities. However, such a configuration would result in an increase in the size of a chip. Hence, in the present invention, MOS transistors used in the output driving block 430 and the second turn-off voltage sensing circuit 670 are identical only in a ratio (W/L) of a length to a width of a gate to provide almost the same electrical effect, and the sizes of components other than the gate of the MOS transistor used in the second turn-off voltage sensing circuit 670 can be reduced by a predetermined percentage from those of the MOS transistor used in the output driving block 430. As a result, the size of a chip is not unnecessarily increased.

Because the internal voltage VCNT to be generated by the internal voltage generator 400 and the first reference voltage VC can be used to mean the same thing as described above, it is apparent that a comparison of the reference voltages VH and VL with the internal voltage VCNT in the conventional art is similar to a comparison of the reference voltages VH and VL with the first reference voltage VC in the present invention. Accordingly, the fourth comparison voltage COML obtained by comparing the first and third reference voltages VC and VL and amplifying a difference between the two reference voltages in the present invention is similar to the second comparison voltage UPB.

A circuit driven by the fourth comparison voltage COML is enabled by the clock signal CK, and the voltage level of the second sensing signal DETL depends upon the voltage level of the fourth comparison voltage COML. For example, when the fourth comparison voltage COML has a voltage level that is sufficient to turn on the fifth MOS transistor MP3, the second sensing signal DETL has a voltage level that is equal to the high supply voltage VDD.

The second sensing signal DETL is transmitted to the second switch control signal generator 690 via the second transmission circuit 680. The second transmission circuit 680 transmits the second sensing signal DETL every cycle of the clock signal CK. A phase change in the second sensing signal DETL transmitted every cycle of the clock signal CK is reflected in a phase change in the second control signal CNTL.

The second switch control signal generator 690 generates the switch control signals SL0 through SLN in the second group by using a plurality of serially connected shift registers that store and output an input value representing every change of the phase of the second control signal CNTL.

At an early stage, where power is initially supplied to the semiconductor device, a set signal and a reset signal are used to fix outputs of the shift registers to predetermined values. For example, the first shift register 801 of FIG. 8 is set, and the other shift registers 802 through 804 are all reset. An input D of the first shift register 801 is connected to a low supply voltage GND. Hence, an initially set output of the first shift register 801 includes a logic value corresponding to a low supply voltage GND when the second control signal CNTL toggles once. When the second control signal CNTL toggles continuously, the output value of the first shift register 801 is transmitted to the next shift register to which the first sift register 801 is connected, at each toggle.

If a logic value of the 0L switch control signal SL0, which is output by the first shift register 801, is high, the 0L switch SWL0, which is controlled by the 0L switch control signal SL0, is turned on, so that a corresponding junction voltage is used as the third reference voltage VL.

If it is determined in the second offset section control block 650 that the third reference voltage VL does not reach the turn-off voltage, the second control signal CNTL toggles. When the second control signal CNTL toggles, the first shift register 801 stores a logic low value (i.e., GND), and the second sift register 802 stores and outputs a logic high value which is a previous output of the first shift register 801.

When it is determined that the fifth MOS transistor MP3 has not been turned off, the second sensing signal DETL is logic high. Thus, while the second sensing signal DETL is logic high, the second control signal CNTL keeps toggling, because the second inverter 681 of the second transmission circuit 680 inverts the phase of the second sensing signal DETL and outputs the phase-inverted second sensing signal DETL to the second NOR gate 682. In other words, because the logic high state of the second sensing signal DETL is changed to a logic low state while passing through the second inverter 681, and a second sensing signal DETL in a logic low state is input to the second NOR gate 682, the second control signal CNTL, which is output by the second NOR gate 682, is only affected by the clock signal CK. When the fifth MOS transistor MP3 is turned off, and the second sensing signal DETL becomes logic low, the second control signal CNTL stops toggling.

An optimized third reference voltage VL is determined through the above-described process.

A process of determining the second reference voltage VH is similar to the process of determining the third reference voltage VL, so it will not be described herein.

Figure 9:
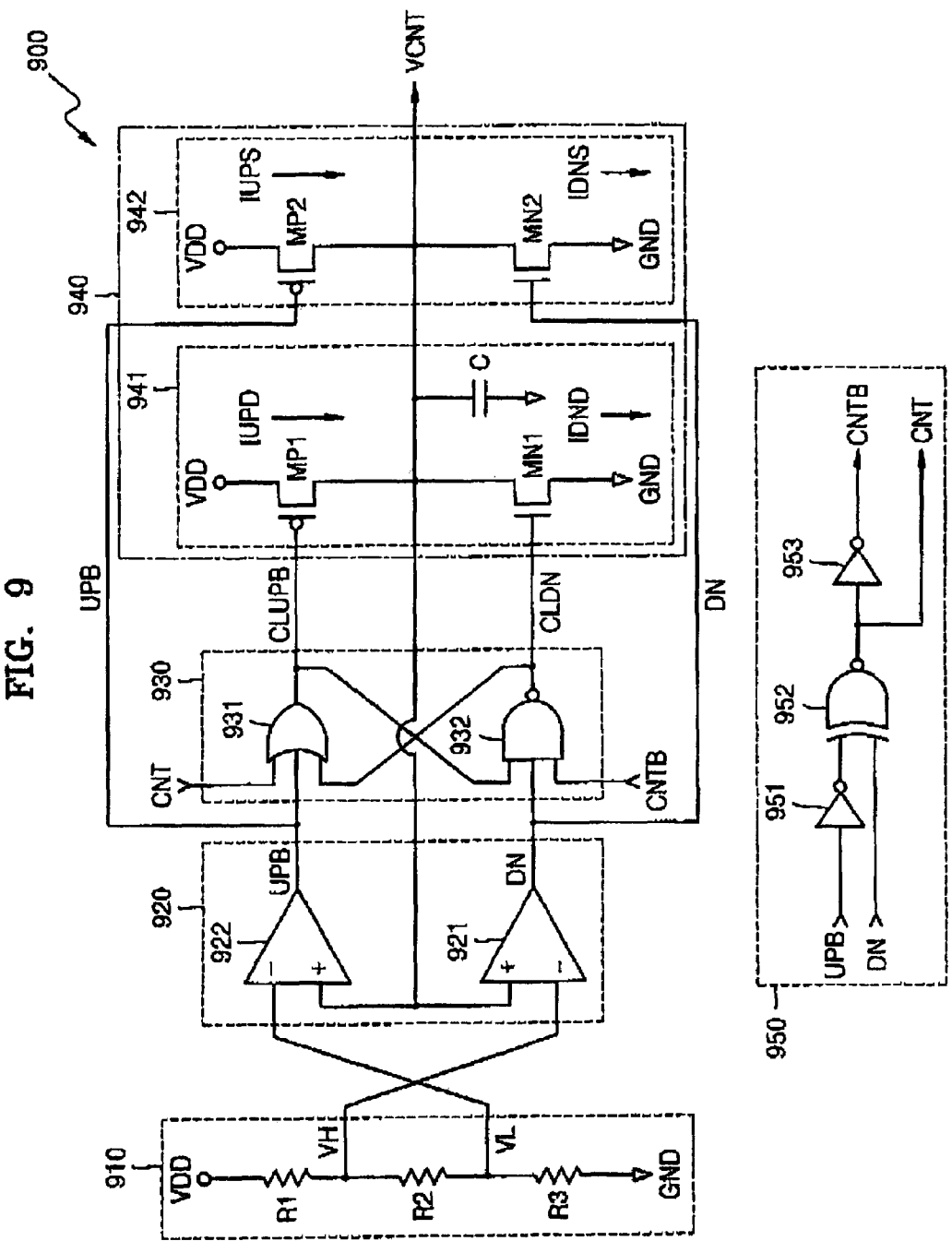
FIG. 9 is a block diagram of an internal voltage generator according to another embodiment of the present invention.

FIG. 9 is a block diagram of an internal voltage generator 900 according to another embodiment of the present invention. Referring to FIG. 9, the internal voltage generator 900 includes a reference voltage generation block 910, a comparator block 920, a control block 930, an output driving block 940, and a first control signal generation block 950.

The reference voltage generation block 910 generates a first reference voltage VL and a second reference voltage VH using voltages dropping among three resistors R1, R2, and R3.

The comparator block 920 compares the first reference voltage VL with the internal voltage VCNT, outputs a first comparison voltage UPB corresponding to a result of the comparison, compares the second reference voltage VH with the internal voltage VCNT, and outputs a second comparison voltage DN corresponding to a result of the comparison. Two comparators 921 and 922 are used.

The control block 930 includes an OR gate 931, which outputs a third control signal CLUPB in response to the first comparison voltage UPB, a first control signal CNT, and a fourth control signal CLDN, and a NAND gate 932, which outputs the fourth control signal CLDN in response to the second comparison voltage DN, a second control signal CNTB, and the third control signal CLUPB. The third and fourth control signals CLUPB and CLDN are not in the same logic state, for example, a logic high state or a logic low state.

The output driving block 940 includes a main output driving block 941 and an auxiliary output driving block 942. The main output driving block 941 includes a first MOS transistor MP1, a second MOS transistor MN1, and a capacitor C. The first MOS transistor MP1 has one end connected to a high supply voltage VDD and a gate to which the third control signal CLUPB is applied. The second MOS transistor MN1 has one end connected to a low supply voltage GND and a gate to which the fourth control signal CLDN is applied. The capacitor C has one end connected to both the other ends of the first and second MOS transistors MP1 and MN1 and outputting the internal voltage VCNT and the other end connected to a low supply voltage GND. The auxiliary output driving block 942 includes a third MOS transistor MP2 and a fourth MOS transistor MN2. The third MOS transistor MP2 has one end connected to a high supply voltage VDD and a gate to which the first control signal CNT is applied. The fourth MOS transistor MN2 has one end connected to a low supply voltage GND and a gate to which the second control signal DN is applied. The other ends of the third and fourth MOS transistors MP2 and MN2 are connected to each other to output the internal voltage VCNT.

The first control signal generation block 950 includes a first inverter 951, an EX-OR gate 952, and a second inverter 953. The first inverter 951 inverts a phase of the first comparison voltage UPB. The EX-OR gate 952 outputs the first control signal CNT in response to an output of the first inverter 951 and the second comparison voltage DN. The second inverter 953 outputs the second control signal CNTB obtained by inverting a phase of the first control signal CNT.

Figure 10:
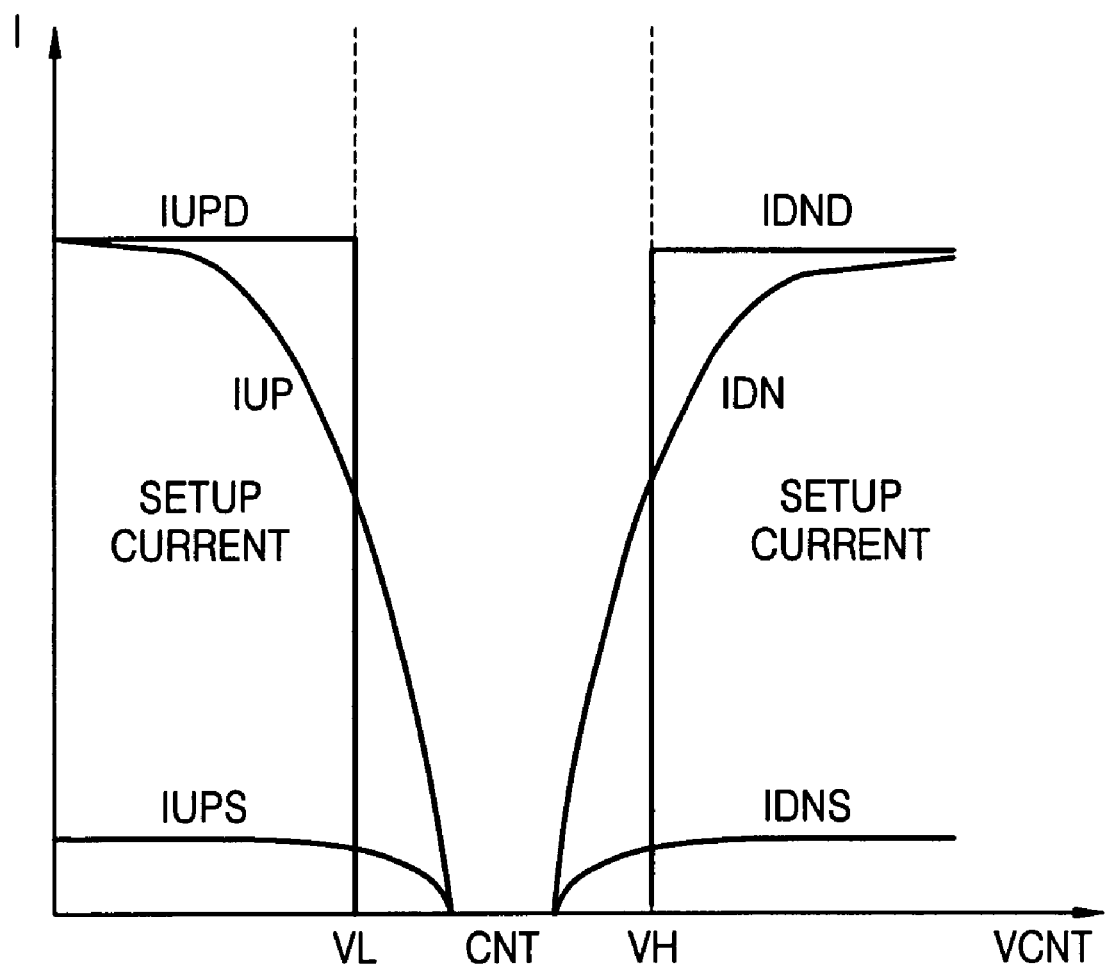
FIG. 10 illustrates the characteristics of currents flowing within an output driving block shown in FIG. 9.

FIG. 10 illustrates currents flowing within the output driving block 940 shown in FIG. 9. More specifically, in FIG. 10, first and second currents IUP and IDN flowing in an output driving block of a conventional internal voltage generator and third, fourth, fifth, and sixth currents IUPD, IDND, IUPS, and IDNS flowing in the output driving block 940 of the internal voltage generator 900 according to the present embodiment of the present invention are shown.

The internal voltage generator of the present embodiment includes a reference voltage generation block 910, a comparator block 920, and a main output driving block 941 that are similar in construction to the conventional configuration. Two comparator signals UPB and DN, which are output by the reference voltage generation block 910, are applied to the main output driving block 941. The first current IUP denotes a current flowing in the first MOS transistor MP1 included in the main output driving block 941, and the second current IDN denotes a current flowing in the second MOS transistor MN1 included in the main output driving block 941.

However, the internal voltage generator 900 of the current embodiment of the present invention includes the reference voltage generation block 910, the comparator block 920, the control block 930, the output driving block 940, and the first control signal generation block 950. The output driving block 940 of the current embodiment includes the main output driving block 941 and the auxiliary output driving block 942. The third current IUPD denotes a current flowing in the first MOS transistor MP1 included in the main output driving block 941, and the fourth current IDND denotes a current flowing in the second MOS transistor MN1 included in the main output driving block 941. The fifth current IUPS denotes a current flowing in the third MOS transistor MP2 included in the auxiliary output driving block 942, and the sixth current IDNS denotes a current flowing in the fourth MOS transistor MN2 included in the auxiliary output driving block 942.

An operation of the internal voltage generator 900 will now be described with reference to FIG. 10.

Internal voltage generation according to the current embodiment of the present invention includes the auxiliary output driving block 942, which has a relatively small driving capability, in addition to the main output driving block 941, which has a relatively large driving capability. It is determined whether a voltage level of the internal voltage VCNT determined at the moment when power is supplied in an initialization stage is in between two reference voltages VL and VH.

When the internal voltage VCNT does not have a voltage level in between two reference voltages VL and VH at the moment when power is supplied in an initialization stage, both the main output driving block 941 and the auxiliary output driving block 942 are operated to reduce the setup time. On the other hand, when the internal voltage VCNT has a voltage level in between two reference voltages VL and VH at the moment when power is supplied in an initialization stage, only the auxiliary output driving block 942 is operated to reduce power consumption. Accordingly, the internal voltage generator 900 can have two effects of reducing the setup time and reducing power consumption.

The comparator block 920 outputs two comparison voltages UPB and DN, which serve as a basis to determine whether the internal voltage VCNT has a voltage level in between the two reference voltages VL and VH, which is a target voltage level. Because the two comparators 921 and 922 having small gains are used to simplify the circuit of the internal voltage generator 900 and to reduce power consumption, the two comparison voltages UPB and DN may be considered to behave as analog signals rather than digital signals in a certain input voltage level sections.

As shown in FIG. 10, a conventional internal voltage generator drives a main output driving block using the two comparison voltages UPB and DN having characteristics of an analog signal, so that the driving capability of the main output driving block degrades in some input voltage level sections. This in turn can lead to an increase of the circuit setup time.

The control block 930, included in the internal voltage generator 900 of the current embodiment of the present invention, transforms the two comparison signals UPB and DN having the characteristics of an analog signal into signals CLUPB and CLDN having characteristics of a digital signal and drives the main output driving block 941 using the signals CLUPB and CLDN. Hence, a difference between the internal voltage VCNT and the first reference voltage VL and a difference between the internal voltage VCNT and the second reference voltage VH become smaller, leading to a reduction of the setup time.

When the control block 930 controls the current flowing in the main output driving block 941 using the two control signals CLUPB and CLDN, the two MOS transistors MP1 and MN1 are controlled to prevent generation of a path of a direct current flowing directly from a high supply voltage VDD to a low supply voltage GND. To achieve this, a latch circuit using a NOR gate 931 and a NAND gate 932 is used as the control block 930.

Accordingly, the two control signals CLUPB and CLDN output by the control block 930 control the first MOS transistor MP1 to be always turned off when the second MOS transistor MN1 is turned on. For example, the third control signal CLUPB is kept logic high when the fourth control signal CLDN is logic high, so that the first MOS transistor MP1 is always turned off when the second MOS transistor MN1 is turned on. On the other hand, the fourth control signal CLDN is kept logic low when the third control signal CLUPB is logic low, so that the second MOS transistor MN1 is always turned off when the first MOS transistor MP1 is turned on.

When the set-up internal voltage VCNT has a voltage level in between the first and second reference voltages VL and VH, the first and second control signals CNT and CNTB generated by the first control signal generation block 950 are logic high and logic low, respectively. Consequently, the third and fourth control signals CLUPB and CLDN are logic high and logic low, respectively. The first and second MOS transistors MP1 and MN1 receive the logic-high third control signal CLUPB and the logic-low fourth control signal CLDN, respectively, and are then turned off.

When the voltage level of the set-up internal voltage VCNT is not in between the first and second reference voltages VL and VH, the first and second control signals CNT and CNTB generated by the first control signal generation block 950 are logic low and logic high, respectively. Logic states of the third and fourth control signals CLUPB and CLDN are determined by the two comparison signals UPB and DN and the two control signals CNT and CNTB. Hence, both the main and auxiliary output driving blocks 941 and 942 operate, thus reducing the setup time.

Although not shown in the drawings, it is apparent that another embodiment of an internal voltage generator in accordance with the present invention can be produced by one of ordinary skill in the art by combining the internal voltage generators of FIGS. 4 and 9.

As described above, an internal voltage generator according to the present invention can reduce the amount of dead zone through optimization of an offset section and can further reduce the setup time and power consumption. In addition, because an internal voltage output by the internal voltage generator is fed back and used in the optimization of the offset section, an optimal offset section can be set with little influence of errors caused by variation in process parameters.

While the present invention has been particularly shown and described with reference to exemplary embodiments thereof, it will be understood by those of ordinary skill in the art that various changes in form and detail may be made herein without departing from the spirit and scope of the present invention as defined by the following claims.

What is claimed is:

1. An internal voltage generator comprising:
   a reference voltage generation block outputting a first reference voltage, a second reference voltage, and a third reference voltage in response to a plurality of switch control signals;
   a comparator block outputting a first comparison voltage as a result of a comparison between an internal voltage and the third reference voltage and a second comparison voltage as a result of a comparison between the internal voltage and the second reference voltage;
   an output driving block outputting the internal voltage in response to the first and second comparison voltages; and
   an offset section control block outputting the plurality of switch control signals in response to the first, second, and third reference voltages and a clock signal.

2. The internal voltage generator of claim 1, wherein the comparator block comprises:
   a first comparator comparing the internal voltage with the third reference voltage to generate the first comparison signal; and
   a second comparator comparing the internal voltage with the second reference voltage to generate the second comparison signal.

3. The internal voltage generator of claim 1, wherein the output driving block comprises:
   a first MOS transistor having one end connected to a high supply voltage and a gate to which the first comparison voltage is applied;
   a second MOS transistor having one end connected to a low supply voltage and a gate to which the second comparison voltage is applied; and
   a first capacitor having one end connected to both the other ends of the first and second MOS transistors and the other end connected to the low power supply voltage,
   wherein the internal voltage is output at a common port shared by the first and second MOS transistors and the first capacitor.

4. The internal voltage generator of claim 3, wherein the first MOS transistor is a P-type MOS transistor, and the second MOS transistor is an N-type MOS transistor.

5. The internal voltage generator of claim 1, wherein the reference voltage generation block comprises:
   a plurality of resistors serially connected between a high supply voltage and a low supply voltage;
   the first reference voltage being a voltage at a node connection of a predetermined two of the serially connected resistors;
   a first switch block outputting the second reference voltage corresponding to a voltage at a selected node connection of a plurality of node connections of resistors between the voltage corresponding to the first reference voltage and the high supply voltage, in response to a first plurality of switch control signals; and a second switch block outputting the third reference voltage corresponding to a voltage at a selected node connection of a plurality of node connections of resistors between the voltage corresponding to the first reference voltage and the low supply voltage, in response to the residual switch control signals.

6. The internal voltage generator of claim 5, wherein:
the first plurality of switch control signals are a 0H (where 0 is zero) switch control signal through an NH (where N is an integer greater than 0) switch control signal;
the resistors between the joint voltage corresponding to the first reference voltage and the high supply voltage include:
a 0H resistor having one end connected to the first reference voltage;
a 1H resistor having one end connected to the other end of the 0H resistor;
a 2H resistor having one end connected to the other end of the 1H resistor; through
a (N+1)H resistor having one end connected to the other end of an NH resistor and the other end connected to the high supply voltage; and
the first switch block comprises:
a 0H switch having one end connected to a common node of the 0H and 1H resistors, operating in response to the 0H switch control signal;
a 1H switch having one end connected to a common node of the 1H and 2H resistors, operating in response to the 1H switch control signal; through
an NH switch having one end connected to a common node of the NH and (N+1)H resistors, operating in response to the NH switch control signal,
wherein the other ends of the 0H through NH switches are commonly connected to one other and the second reference voltage is output through one of the other ends of the 0H through NH switches.

7. The internal voltage generator of claim 5, wherein:
the second plurality of switch control signals are a 0L (where 0 is zero) switch control signal through an NL (where N is an integer greater than 0) switch control signal;
the resistors between the joint voltage corresponding to the first reference voltage and the low supply voltage include:
a 0L resistor having one end connected to the first reference voltage;
a 1L resistor having one end connected to the other end of the 0L resistor;
a 2L resistor having one end connected to the other end of the 1L resistor; through
a (N+1)L resistor having one end connected to the other end of an NL resistor and the other end connected to the low supply voltage; and
the second switch block comprises:
a 0L switch having one end connected to a common node of the 0L and 1L resistors, operating in response to the 0L switch control signal;
a 1L switch having one end connected to a common node of the 1H and 2H resistors, operating in response to the 1L switch control signal; through
an NL switch having one end connected to a common node of the NL and (N+1)L resistors, operating in response to the NL switch control signal,
wherein the other ends of the 0L through NL switches are commonly connected to one other and the third reference voltage is output through one of the other ends of the 0L through NL switches.

8. The internal voltage generator of claim 5, wherein the first reference voltage has a voltage level in between the high supply voltage and the low supply voltage.

9. The internal voltage generator of claim 3, wherein the offset section control block comprises:
a first offset section control block outputting an 0H switch control signal through an NH switch control signal in response to the first and second reference voltages and the clock signal; and
a second offset section control block outputting an 0L switch control signal through an NL switch control signal in response to the first and third reference voltages and the clock signal.

10. The internal voltage generator of claim 9, wherein the first offset section control block comprises:
a third comparator outputting a third comparison voltage as a result of a comparison between the first and second reference voltages;
a first turn-off voltage sensing circuit sensing in response to the third comparison voltage and the clock signal whether the third comparison voltage has a voltage level satisfying a predetermined condition, and outputting a first sensing signal corresponding to a result of the sensing;
a first transmission circuit outputting a first control signal into which the first sensing signal is transformed in response to the clock signal; and
a first switch control signal generator outputting the 0H through NH switch control signals in response to the first control signal.

11. The internal voltage generator of claim 10, wherein the predetermined condition is to determine whether the third comparison voltage is sufficient to turn off a predetermined MOS transistor included in the output driving block.

12. The internal voltage generator of claim 11, wherein the predetermined MOS transistor is the second MOS transistor.

13. The internal voltage generator of claim 12, wherein the first turn-off voltage sensing circuit comprises:
a third MOS transistor having one end connected to a high supply voltage and a gate to which the clock signal is applied;
a fourth MOS transistor having one end connected to a low supply voltage and a gate to which the third comparison voltage is applied; and
a second capacitor having one end connected to both the other ends of the third and fourth MOS transistors and the other end connected to a low supply voltage,
wherein the first sensing signal is output at a common port shared by the third and fourth MOS transistors and the second capacitor.

14. The internal voltage generator of claim 13, wherein:
a ratio of a length to a width of a gate of the third MOS transistor is identical to a ratio of a length to a width of a gate of the first MOS transistor; and
a ratio of a length to a width of a gate of the fourth MOS transistor is identical to a ratio of a length to a width of a gate of the second MOS transistor.

15. The internal voltage generator of claim 10, wherein the first transmission circuit comprises:
a first inverter inverting a phase of the first sensing signal; and a second NOR gate outputting the first control signal in response to an output of the first inverter and the clock signal.

16. The internal voltage generator of claim 10, wherein the first switch control signal generator further receives a set signal and a reset signal and comprises:
   a 1H shift register setting an output according to the set signal and, in response to the first control signal, storing a predetermined signal and outputting the 0H switch control signal;
   a 2H shift register resetting an output according to the reset signal and, in response to the first control signal, storing the 0H switch control signal and outputting the 1H switch control signal;
   a 3H shift register resetting an output according to the reset signal and, in response to the first control signal, storing the 2H switch control signal and outputting the 2H switch control signal; through
   an (N+1)H shift register resetting an output according to the reset signal and, in response to the first control signal, storing an NH switch control signal output from an NH shift register and outputting the NH switch control signal.

17. The internal voltage generator of claim 9, wherein the second offset section control block comprises:
   a fourth comparator outputting a fourth comparison voltage as a result of a comparison between the first and third reference voltages;
   a second turn-off voltage sensing circuit sensing in response to the fourth comparison voltage and the clock signal whether the fourth comparison voltage has a voltage level satisfying a predetermined condition, and outputting a second sensing signal corresponding to a result of the sensing;
   a second transmission circuit outputting a second control signal into which the second sensing signal is transformed in response to the clock signal; and
   a second switch control signal generator outputting the 0L through NL switch control signals in response to the second control signal.

18. The internal voltage generator of claim 17, wherein the predetermined condition is to determine whether the third comparison voltage is sufficient to turn off a predetermined MOS transistor included in the output driving block.

19. The internal voltage generator of claim 18, wherein the predetermined MOS transistor is the first MOS transistor.

20. The internal voltage generator of claim 19, wherein the second turn-off voltage sensing circuit comprises:
   a fifth MOS transistor having one end connected to a high supply voltage and a gate to which the fourth comparison voltage is applied;
   a sixth MOS transistor having one end connected to a low supply voltage and a gate to which the clock signal is applied; and
   a third capacitor having one end connected to both the other ends of the fifth and sixth MOS transistors and the other end connected to a low supply voltage,
   wherein the second sensing signal is output at a common port shared by the fifth and sixth MOS transistors and the third capacitor.

21. The internal voltage generator of claim 20, wherein:
   a ratio of a length to a width of a gate of the fifth MOS transistor is identical to a ratio of a length to a width of a gate of the first MOS transistor; and
   a ratio of a length to a width of a gate of the sixth MOS transistor is identical to a ratio of a length to a width of a gate of the second MOS transistor.

22. The internal voltage generator of claim 17, wherein the second transmission circuit comprises:
   a second inverter inverting a phase of the second sensing signal; and
   a second NOR gate outputting the second control signal in response to an output of the second inverter and the clock signal.

23. The internal voltage generator of claim 17, wherein the second switch control signal generator further receives a set signal and a reset signal and comprises:
   a 1L shift register setting an output according to the set signal and, in response to the second control signal, storing a predetermined signal and outputting the 0L switch control signal;
   a 2L shift register resetting an output according to the reset signal and, in response to the second control signal, storing the 0L switch control signal and outputting the 1L switch control signal;
   a 3L shift register resetting an output according to the reset signal and, in response to the second control signal, storing the 2L switch control signal and outputting the 2L switch control signal; through
   an (N+1)L shift register resetting an output according to the reset signal and, in response to the second control signal, storing an NL switch control signal output from an NL shift register and outputting the NL switch control signal.

24. The internal voltage generator of claim 1, wherein the clock signal continues a clocking operation for a period of time that is long enough to generate at least all of the plurality of switch control signals.

25. An internal voltage generator comprising:
   a reference voltage generation block outputting a first reference voltage and a second reference voltage;
   a comparator block outputting a first comparison voltage as a result of a comparison between an internal voltage and the first reference voltage and a second comparison voltage as a result of a comparison between the internal voltage and the second reference voltage;
   a first control signal generation block outputting a first control signal and a second control signal in response to the first and second comparison voltages;
   a control block generating a third control signal and a fourth control signal in response to the first and second comparison voltages and the first and second control signals; and
   an output driving block generating the internal voltage in response to the first and second comparison voltages and the third and fourth control signals.

26. The internal voltage generator of claim 25, wherein the first control signal generation block comprises:
   a first inverter inverting a phase of the first comparison signal;
   an EX-OR gate outputting the first control signal in response to an output of the first inverter and the second comparison voltage; and
   a second inverter outputting the second control signal obtained by inverting the first control signal.

27. The internal voltage generator of claim 25, wherein a logic high or low state of the third control signal is opposite a logic high or low state of the fourth control signal.

28. The internal voltage generator of claim 25, wherein the control block comprises:

a NOR gate outputting the third control signal in response to the first comparison voltage, the first control signal, and the fourth control signal; and a NAND gate outputting the fourth control signal in response to the second comparison voltage, the second control signal, and the third control signal.

29. The internal voltage generator of claim 25, wherein the output driving block comprises:
a main output driving block operating in response to the third and fourth control signals; and
an auxiliary output driving block operating in response to the first and second comparison voltages,
wherein the main and auxiliary output driving blocks commonly output the internal voltage.

30. The internal voltage generator of claim 29, wherein the main output driving block comprises:
a first MOS transistor having one end connected to a high supply voltage and a gate to which the third control signal is applied;
a second MOS transistor having one end connected to a low supply voltage and a gate to which the fourth control signal is applied; and
a capacitor having one end connected to both the other ends of the first and second MOS transistors and the other end connected to the low power supply voltage,
wherein the internal voltage is output at a common port shared by the first and second MOS transistors and the capacitor.

31. The internal voltage generator of claim 29, wherein the auxiliary output driving block comprises:
a third MOS transistor having one end connected to a high supply voltage and a gate to which the first control signal is applied; and
a fourth MOS transistor having one end connected to a low supply voltage and a gate to which the second control signal is applied,
wherein the other ends of the third and fourth MOS transistors are connected to each other and output the internal voltage.

32. An internal voltage generator comprising:
a reference voltage generation block outputting a first reference voltage, a second reference voltage, and a third reference voltage in response to a plurality of switch control signals;
a comparator block outputting a first comparison voltage as a result of a comparison between an internal voltage and the third reference voltage and a second comparison voltage as a result of a comparison between the internal voltage and the second reference voltage;
a first control signal generation block outputting a first control signal and a second control signal in response to the first and second comparison voltages, respectively;
a control block generating a third control signal and a fourth control signal in response to the first and second comparison voltages and the first and second control signals;
an output driving block generating the internal voltage in response to the third and fourth control signals; and
an offset section control block outputting the plurality of switch control signals in response to the first, second, and third reference voltages and a clock signal.

33. The internal voltage generator of claim 32, wherein the reference voltage generation block comprises:
a plurality of resistors serially connected between a high supply voltage and a low supply voltage;

the first reference voltage being a voltage at a node connection of a predetermined two of the serially connected resistors;
a first switch block outputting the second reference voltage corresponding to a voltage at a selected node connection of a plurality of node connections of resistors between the voltage corresponding to the first reference voltage and the high supply voltage, in response to a first plurality of switch control signals; and
a second switch block outputting the third reference voltage corresponding to a voltage at a selected node connection of a plurality of node connections of resistors between the voltage corresponding to the first reference voltage and the low supply voltage, in response to a second plurality of switch control signals.

34. The internal voltage generator of claim 33, wherein:
the first plurality of switch control signals are a 0H (where 0 is zero) switch control signal through an NH (where N is an integer greater than 0) switch control signal;
the resistors between the joint voltage corresponding to the first reference voltage and the high supply voltage include:
a 0H resistor having one end connected to the first reference voltage;
a 1H resistor having one end connected to the other end of the 0H resistor;
a 2H resistor having one end connected to the other end of the 1H resistor; through
a (N+1)H resistor having one end connected to the other end of an NH resistor and the other end connected to the high supply voltage; and
the first switch block comprises:
a 0H switch having one end connected to a common node of the 0H and 1H resistors, operating in response to the 0H switch control signal;
a 1H switch having one end connected to a common node of the 1H and 2H resistors, operating in response to the 1H switch control signal; through
an NH switch having one end connected to a common node of the NH and (N+1)H resistors, operating in response to the NH switch control signal,
wherein the other ends of the 0H through NH switches are commonly connected to one other and the second reference voltage is output through one of the other ends of the 0H through NH switches.

35. The internal voltage generator of claim 33, wherein:
the second plurality of switch control signals are a 0L (where 0 is zero) switch control signal through an NL (where N is an integer greater than 0) switch control signal;
the resistors between the joint voltage corresponding to the first reference voltage and the low supply voltage include:
a 0L resistor having one end connected to the first reference voltage;
a 1L resistor having one end connected to the other end of the 0L resistor;
a 2L resistor having one end connected to the other end of the 1L resistor; through
a (N+1)L resistor having one end connected to the other end of an NL resistor and the other end connected to the low supply voltage; and
the second switch block comprises:
a 0L switch having one end connected to a common node of the 0L and 1L resistors, operating in response to the 0L switch control signal;

a 1L switch having one end connected to a common node of the 1H and 2H resistors, operating in response to the 1L switch control signal; through an NL switch having one end connected to a common node of the NL and (N+1)L resistors, operating in response to the NL switch control signal, wherein the other ends of the 0L through NL switches are commonly connected to one other and the third reference voltage is output through one of the other ends of the 0L through NL switches.

36. The internal voltage generator of claim 32, wherein the first control signal generation block comprises:
a first inverter inverting a phase of the first comparison signal;
an EX-OR gate outputting the first control signal in response to an output of the first inverter and the second comparison voltage; and
a second inverter outputting the second control signal obtained by inverting the first control signal.

37. The internal voltage generator of claim 32, wherein the control block comprises:
a NOR gate outputting the third control signal in response to the first comparison voltage, the first control signal, and the fourth control signal; and
a NAND gate outputting the fourth control signal in response to the second comparison voltage, the second control signal, and the third control signal.

38. The internal voltage generator of claim 32, wherein the output driving block comprises:
a main output driving block operating in response to the third and fourth control signals; and
an auxiliary output driving block operating in response to the first and second comparison voltages,
wherein the main and auxiliary output driving blocks commonly output the internal voltage.

39. The internal voltage generator of claim 38, wherein the main output driving block comprises:
a first MOS transistor having one end connected to a high supply voltage and a gate to which the third control signal is applied;
a second MOS transistor having one end connected to a low supply voltage and a gate to which the fourth control signal is applied; and
a capacitor having one end connected to both the other ends of the first and second MOS transistors and the other end connected to the low power supply voltage,
wherein the internal voltage is output at a common port shared by the first and second MOS transistors and the capacitor.

40. The internal voltage generator of claim 38, wherein the auxiliary output driving block comprises:
a third MOS transistor having one end connected to a high supply voltage and a gate to which the first control signal is applied; and
a fourth MOS transistor having one end connected to a low supply voltage and a gate to which the second control signal is applied,
wherein the other ends of the third and fourth MOS transistors are connected to each other and output the internal voltage.

41. The internal voltage generator of claim 32, wherein the offset section control block comprises:
a first offset section control block outputting an 0H switch control signal through an NH switch control signal in response to the first and second reference voltages and the clock signal; and a second offset section control block outputting an 0L switch control signal through an NL switch control signal in response to the first and third reference voltages and the clock signal.

42. The internal voltage generator of claim 41, wherein the first offset section control block comprises:
a third comparator outputting a third comparison voltage as a result of a comparison between the first and second reference voltages;
a first turn-off voltage sensing circuit sensing in response to the third comparison voltage and the clock signal whether the third comparison voltage has a voltage level satisfying a predetermined condition, and outputting a first sensing signal corresponding to a result of the sensing;
a first transmission circuit outputting a first control signal into which the first sensing signal is transformed in response to the clock signal; and
a first switch control signal generator outputting the 0H through NH switch control signals in response to the first control signal.

43. The internal voltage generator of claim 42, wherein the predetermined condition is to determine whether the third comparison voltage is suficient to turn off a predetermined MOS transistor included in the output driving block.

44. The internal voltage generator of claim 42, wherein the first turn-off voltage sensing circuit comprises:
a third MOS transistor having one end connected to a high supply voltage and a gate to which the clock signal is applied;
a fourth MOS transistor having one end connected to a low supply voltage and a gate to which the third comparison voltage is applied; and
a second capacitor having one end connected to both the other ends of the third and fourth MOS transistors and the other end connected to a low supply voltage,
wherein the first sensing signal is output at a common port shared by the third and fourth MOS transistors and the second capacitor.

45. The internal voltage generator of claim 42, wherein the first transmission circuit comprises:
a first inverter inverting a phase of the first sensing signal; and
a second NOR gate outputting the first control signal in response to an output of the first inverter and the clock signal.

46. The internal voltage generator of claim 42, wherein the first switch control signal generator further receives a set signal and a reset signal and comprises:
a 1H shift register setting an output according to the set signal and, in response to the first control signal, storing a predetermined signal and outputting the 0H switch control signal;
a 2H shift register resetting an output according to the reset signal and, in response to the first control signal, storing the 0H switch control signal and outputting the 1H switch control signal;
a 3H shift register resetting an output according to the reset signal and, in response to the first control signal, storing the 2H switch control signal and outputting the 2H switch control signal; through
an (N+1)H shift register resetting an output according to the reset signal and, in response to the first control signal, storing an NH switch control signal output from an NH shift register and outputting the NH switch control signal.

47. The internal voltage generator of claim 41, wherein the second offset section control block comprises:
- a fourth comparator outputting a fourth comparison voltage as a result of a comparison between the first and third reference voltages;
- a second turn-off voltage sensing circuit sensing in response to the fourth comparison voltage and the clock signal whether the fourth comparison voltage has a voltage level satisfying a predetermined condition, and outputting a second sensing signal corresponding to a result of the sensing;
- a second transmission circuit outputting a second control signal into which the second sensing signal is transformed in response to the clock signal; and
- a second switch control signal generator outputting the 0L through NL switch control signals in response to the second control signal.

48. The internal voltage generator of claim 47, wherein the predetermined condition is to determine whether the third comparison voltage is sufficient to turn off a predetermined MOS transistor included in the output driving block.

49. The internal voltage generator of claim 47, wherein the second turn-off voltage sensing circuit comprises:
- a fifth MOS transistor having one end connected to a high supply voltage and a gate to which the fourth comparison voltage is applied;
- a sixth MOS transistor having one end connected to a low supply voltage and a gate to which the clock signal is applied; and
- a third capacitor having one end connected to both the other ends of the fifth and sixth MOS transistors and the other end connected to a low supply voltage,
- wherein the second sensing signal is output at a common port shared by the fifth and sixth MOS transistors and the third capacitor.

50. The internal voltage generator of claim 47, wherein the second transmission circuit comprises:
- a second inverter inverting a phase of the second sensing signal; and
- a second NOR gate outputting the second control signal in response to an output of the second inverter and the clock signal.

51. The internal voltage generator of claim 47, wherein the second switch control signal generator further receives a set signal and a reset signal and comprises:
- a 1L shift register setting an output according to the set signal and, in response to the second control signal, storing a predetermined signal and outputting the 0L switch control signal;
- a 2L shift register resetting an output according to the reset signal and, in response to the second control signal, storing the 0L switch control signal and outputting the 1L switch control signal;
- a 3L shift register resetting an output according to the reset signal and, in response to the second control signal, storing the 2L switch control signal and outputting the 2L switch control signal; through
- an (N+1)L shift register resetting an output according to the reset signal and, in response to the second control signal, storing an NL switch control signal output from an NL shift register and outputting the NL switch control signal.

52. The internal voltage generator of claim 32, wherein the clock signal continues a clocking operation for a period of time that is long enough to generate at least all of the plurality of switch control signals.

* * * * *